United States Patent [19]
Roks

[11] Patent Number: 5,652,442
[45] Date of Patent: Jul. 29, 1997

[54] CHARGE COUPLED DEVICE AND IMAGING DEVICE HAVING A CHARGE COUPLED DEVICE

[75] Inventor: Edwin Roks, Eindhoven, Netherlands

[73] Assignee: U.S. Philips Corporation, New York, N.Y.

[21] Appl. No.: 493,045

[22] Filed: Jun. 21, 1995

[30] Foreign Application Priority Data

Jun. 23, 1994 [EP] European Pat. Off. ............ 94201799

[51] Int. Cl.$^6$ ..................... H01L 27/148; H01L 29/768
[52] U.S. Cl. .................. 257/239; 257/223; 257/230; 257/240; 257/243
[58] Field of Search ..................... 257/222, 223, 257/230, 231, 239, 240, 243

[56] References Cited

U.S. PATENT DOCUMENTS

| | | | |
|---|---|---|---|
| 4,074,302 | 2/1978 | Brewer | 357/24 |
| 4,984,045 | 1/1991 | Matsunaga | 257/239 |
| 5,223,725 | 6/1993 | Miwada | 257/239 |
| 5,229,630 | 7/1993 | Hamasaki | 257/239 |
| 5,357,128 | 10/1994 | Shinji | 257/239 |

OTHER PUBLICATIONS

"A highly sensitive on–chip charge detector for CCD area image sensor" by Matsunaga et al, IEEE Journal of Solid–State Circuits, vol. 26, No. 4, Apr. 1991, pp. 652–656.

*Primary Examiner*—Ngân V. Ngô
*Attorney, Agent, or Firm*—Steven R. Biren

[57] ABSTRACT

The invention relates to a charge coupled device with a buried channel in which charge is detected by a MOST (MOS transistor) incorporated in the channel and having a surface channel of the conductivity type opposed to that of the charge coupled device. The source zone is situated in the centre of the CCD channel and is formed simultaneously with the channel bounding zone. The gate electrode comprises two portions situated on either side of the source zone, which portions, seen at the surface, do not overlap the source and drain zones. Below the gate electrode, a zone is formed of the same conductivity type as but with a higher doping than the CCD channel, which zone forms a charge storage region for the charge packet to be read out during the reading-out process. The source and drain zones are connected to the MOST channel region by means of extensions. The detector can be manufactured in a self-aligned manner, has a high charge storage capacity, a good noise behaviour, and a high speed.

8 Claims, 3 Drawing Sheets

CHARGE COUPLED DEVICE AND IMAGING DEVICE HAVING A CHARGE COUPLED DEVICE

BACKGROUND OF THE INVENTION

The invention relates to a charge coupled device of the buried channel type comprising a semiconductor body which at a surface is provided with a charge transport channel in the form of a surface region of a first conductivity type which is laterally bounded in the semiconductor body by a bounding region of the opposed, second conductivity type and which is provided with a charge detector in the form of an insulated-gate surface-channel field effect transistor, a surface zone of the second conductivity type being provided locally in the charge transport channel so as to form a source zone of the field effect transistor, while potions of the bounding region of the second conductivity type on either side of the charge transport channel form a drain zone of the field effect transistor adjacent the source zone, and portions of the charge transport channel between the source and drain zones form a channel region of the field effect transistor. The invention also relates to an imaging device provided with such a charge coupled device.

A charge coupled device of this type is known inter alia from U.S. Pat. No. 4,074,302. Charge coupled devices are described therein with an n-type buried channel which is provided with a p-type insulated-gate surface-channel field effect transistor with which the size of the charge packets can be determined. The source zone may be formed by a p-type surface zone in the n-type CCD channel, while the drain zone is formed by an adjoining portion of the p-type region which forms a lateral boundary of the CCD channel. The current direction in the MOS transistor (called MOST hereinafter for short) is usually transverse to the current direction in the CCD channel. During operation, a voltage is applied to the gate electrode of the MOST in excess Of the threshold voltage of the MOST. The charge packet to be read; which consists of a packet of electrons, is transported to below the MOST channel. The concentration of the n-type doping in the CCD channel below the MOST is increased for the purpose of charge storage below the MOST. The charge packet acts as the backgate of the MOST, whose potential, i.e. number of electrons in the charge packet, modulates the conduction in the MOST channel. The value of the charge packet can be determined through measurement of the conductivity in the channel, for example in that the MOST is included in a source follower circuit. After read-out, the charge packet is further transported for subsequent processing or drained off. Since all electrons are essentially removed from the charge storage location below the MOST during this, there is no or at least substantially no reset noise such as does occur in, for example, an output with floating diffusion, where the charge is stored in an electrically floating, highly doped zone which is connected, for example, to a source follower. FIG. 4 of U.S. Pat. No. 4,074,302 shows an embodiment in which the MOST channel is limited to approximately half the width of the CCD channel, whereby the sensitivity of the detector is further enhanced. It is indeed indicated in the accompanying description that the MOST may also be made double-sided, so that the MOST will extend over practically the entire width of the CCD channel, but it is also stated that this is to the detriment of the sensitivity. The transistor in this embodiment, moreover, cannot be manufactured by self-alignment, which renders the production process more difficult, in particular as the dimensions of the device become increasingly smaller.

In the design of the charge detector, requirements as to inter alia noise behaviour, charge capacity, bandwidth, and speed are also to be met. When the detector is connected in a source follower configuration, the signal-to-noise ratio becomes generally better in proportion as the current through the transistor is greater for a charge packet of a given size, i.e. in proportion as the W/L ratio in the transistor is higher. Usually, however, an increase in the width W of the transistor is accompanied by a decrease in the sensitivity. Since a high sensitivity is usually preferred, most known configurations have a fairly indifferent quality as to their noise behaviour. Since optimization of the sensitivity often takes place to the detriment of, for example, the maximum size of the charge packet, however, it may be of major advantage to accept a somewhat smaller sensitivity if other important properties, such as the charge capacity, can be improved thereby.

In addition, known embodiments are usually designed such that the length L of the channel region is so much greater than the length L of the clock electrodes of the charge coupled device that the output stage is much slower than the remainder of the device.

SUMMARY OF THE INVENTION

The invention has for its object inter alia to provide a charge coupled device with an output amplifier which has a high signal-to-noise ratio in addition to a sufficiently high sensitivity. A further object of the invention is to provide such a device which can be operated at a sufficiently high speed. The invention in addition envisages to supply such a device which can be manufactured at least for the major part in a self-aligned manner.

According to the invention, a charge coupled device is characterized in that the gate electrode comprises two sub-regions which, seen at the surface, are situated on either side of the source zone and which extend between the source zone and the bounding region without overlap, one or several zones of the same conductivity type but with a higher doping concentration than the charge transport channel being provided in the charge transport channel, which zones extend at least for the major part exclusively below the sub-regions of the gate electrode, while the source and drain zones are provided with extensions of the second conductivity type which, seen at the surface, extend between the source and drain zones on the one hand and the sub-regions of the gate electrode on the other hand.

Owing to the double-sided design of the field effect transistor, a channel of comparatively great width is obtained, which is favourable for the signal-to-noise ratio. This is achieved without the gate electrode being given a width at which the speed of the subjacent charge transport channel is reduced to an unacceptable extent. The fact that the more highly doped zone defining a charge storage location for the charge packet to be detected is provided mainly below the gate electrode of the field effect transistor considerably increases the sensitivity of the detector. The device can be manufactured in a substantially serf-aligned manner in that the transistor is here given a construction related to LDD structures in MOST ICs, as will become apparent from the description of the Figures.

In a preferred embodiment, which has the advantage inter alia that the number of process steps remains limited, the source zone and the bounding region of the second conductivity type are formed by zones which were provided in the semiconductor body in one and the same doping step. Advantageously, the source zone and the bounding region may thus extend from the surface over at least substantially the entire thickness of the charge transport channel into the semiconductor body. A preferred embodiment in which short-circuits between the source zone and the bounding region are prevented in a simple manner, which can be readily achieved in imaging devices in which the substrate serves as an anti-blooming drain, is characterized in that the semiconductor body comprises a substrate of the first conductivity type which, at least at the side opposed to the surface, is separated from the charge transport channel by an interposed region of the second conductivity type whose thickness and doping concentration are so small that during operation a depletion region is formed which extends over the entire thickness of the interposed region between the substrate and the charge transport channel. A further embodiment which has the advantage that an overlap, and thus a capacitance between the source and drain zones on the one hand and the gate electrode of the field effect transistor on the other hand remains limited, is characterized in that the extensions of the source and drain zones have a thickness which is smaller than that of the source and drain zones.

In conventional devices, the charge coupled device comprises an n-channel and the field effect transistor is of the p-channel type. The source and drain zones and the extensions of the field effect transistor are formed by p-type doped zones, where B is used as the dopant. Owing to the comparatively high diffusion rate of B, a fairly great overlap between gate electrode and extensions is then obtained. A dopant of much lower diffusion rate, such as As or Sb, would be preferable, but these dopants give the n-conductivity type. A major embodiment which has the advantage that, for example, As may be used as the dopant for the extensions, is characterized in that the charge transport channel is of the p-type and the source and drain zones of the field effect transistor are of the n-type.

BRIEF DESCRIPTION OF THE DRAWING

The invention will be explained in more detail with reference to an embodiment and the accompanying diagrammatic drawing, in which.

Figure 1:
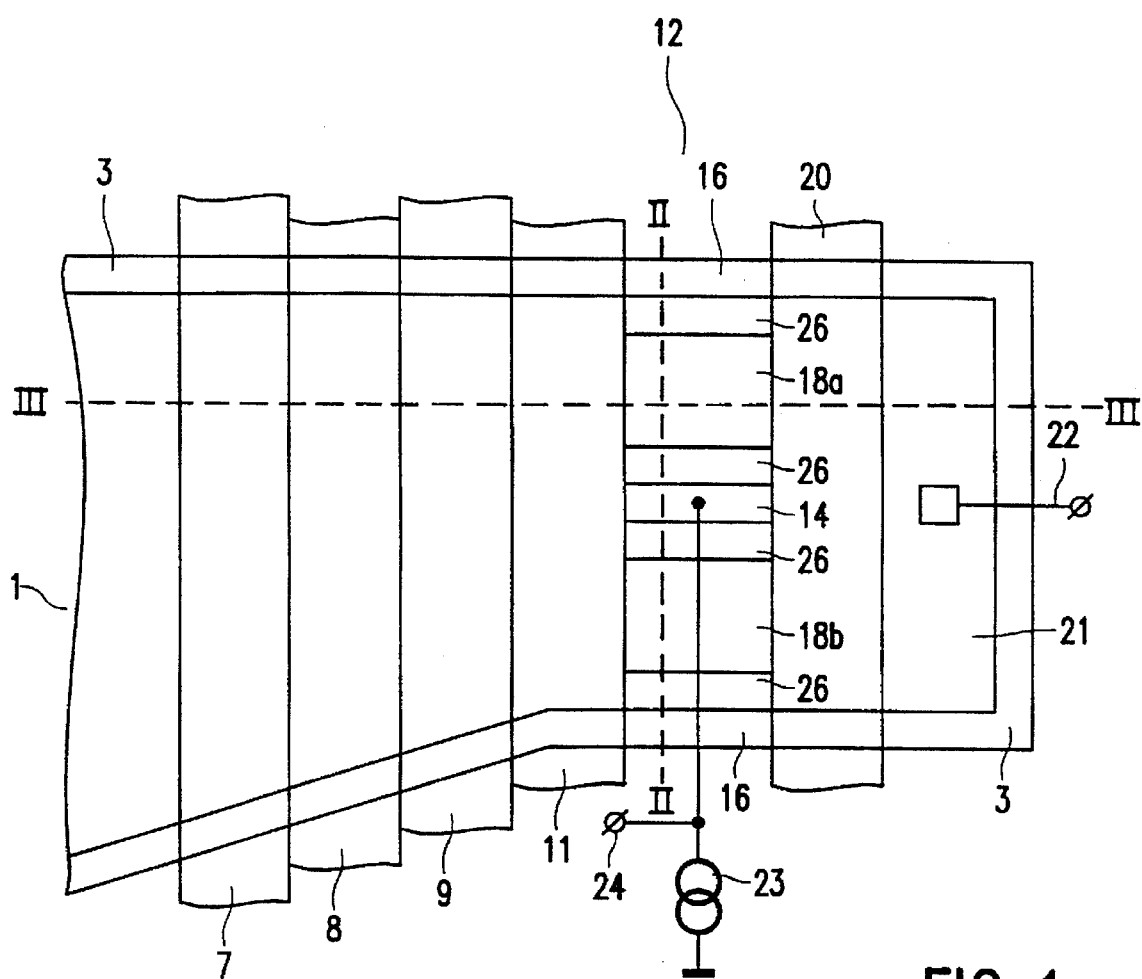
FIG. 1 is a plan view of the output stage of a charge coupled device according to the invention.

It is noted that the drawing is diagrammatic and that the various components are not shown true to scale.

DESCRIPTION OF THE PREFERRED EMBODIMENTS

In the drawing, reference numeral 1 represents the charge transport channel of a buried-channel charge coupled device which forms, for example, a horizontal output register of a two-dimensional imaging device. Since the portion of the device in which an image is received and transformed into electric charge may be of a composition which is known per se, this portion is not shown in any detail in the drawing. It will furthermore be obvious that the output stage to be described below may also be used in other devices such as, for example, as a read-out register in one-dimensional line imaging devices, and devices used for signal processing.

The charge coupled device in this example is of the n-channel type. The charge transport channel 1 is for this purpose formed by an n-type surface region of a monocrystalline semiconductor body 2, which is made of silicon in this example. The charge transport channel 1 is laterally bounded within the semiconductor body 2 by a bounding region 3 formed by semiconductor zones of the opposite, in this example p-type. At the lower side, the channel 1 is bounded by a p-type region 4 which forms a pn junction 5 with the channel 1 across which, as is known, a reverse voltage is applied during operation. The region 4 may extend from the pn junction 5 further downwards through the entire thickness of the semiconductor body 2 in embodiments other than the one depicted here. In the present embodiment, however, the semiconductor body comprises an n-type substrate 6 which is separated from the charge transport channel 1 by the p-type region 4 which forms an interposed region between the substrate 6 and the channel 1. The substrate 6 may be used as a drain for charge carriers in the case of local overexposure, as is known, whereby blooming is prevented. The p-type layer forms a potential barrier between the layer 1 and the substrate 6. To obtain a barrier of a desired level, the thickness and the doping concentration of the layer 4 are chosen such that this layer is depleted throughout its thickness during operation.

Figure 3:
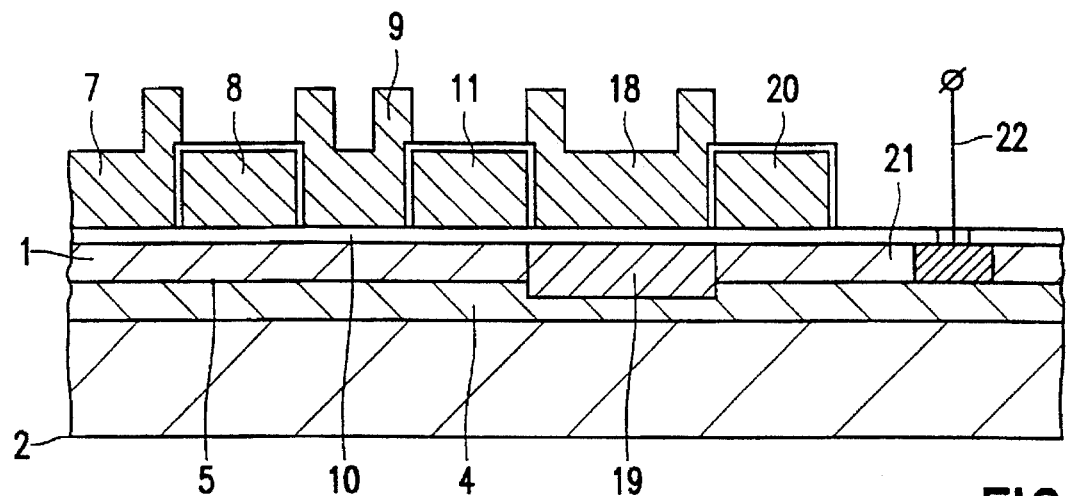
FIG. 3 is a cross-section of the same device taken on the line III—III in FIG. 1.

The charge transport and the charge storage are controlled, as is usual, by means of a system of clock electrodes of which only three are shown in the drawing, i.e. the electrodes 7, 8 and 9 which, as is shown in FIG. 3, may be formed in conventional manner by a two-layer or three-layer structure of polycrystalline silicon (poly). The electrodes 7–9 are provided on a thin gate dielectric 10 of, for example, silicon oxide. Obviously, gate dielectrics made of alternative materials or of combinations of different materials may also be used. The clock electrodes are followed (assuming that the charge transport takes place from left to right) by an electrode 11 which forms an output gate to which a fixed voltage is applied during operation, whereby crosstalk of the clock voltages to the charge detector is prevented.

The output gate 11 is followed by the charge detector 12 formed by an insulated-gate surface-channel field effect transistor, called MOST hereinafter (although the gate is usually not made of a metal but of poly). The MOST is of the p-channel type and comprises a source zone 14 formed by a p-type surface zone locally provided in the n-type charge transport channel 1 and having a connection 15. The portions 16 of the p-type bounding region 3 situated right opposite the zone 14 on either side form the drain zone of the MOST 12 and are provided with diagrammatically depicted drain electrodes 17. The channel of the MOST is formed by the portions of the charge transport channel which adjoin the surface and which lie between the source and drain zones 14 and 16.

According to the invention, the gate electrode of the MOST comprises two sub-regions 18a, 18b which are situated on either side of the source zone 14, as is evident from FIG. 1, and which have no overlap with the source zone 14 and the drain zone 16. The gate electrode sub-regions 18a and 18b may be conductively interconnected outside the plane of drawing. Two n-type zones 19 having a higher doping concentration. than the channel 1 and forming charge storage locations for the charge packets to be detected are formed in the charge transport channel 1 below the gate electrode 18. The source and drain zones 14 and 16 are provided with p-type extensions 26 which extend between the source and drain zones 14 and 16 on the one hand and the gate electrode sub-regions 18a and 18b on the other hand.

The charge detector 12 in the embodiment shown is followed by an insulated gate reset transistor 20, whose source is formed by the charge storage regions 19 of the MOST 12, and whose drain is formed by a portion 21 of the charge transport channel 1 which is provided with an electrical connection 22.

The operation of the device will be briefly described below. A more detailed description may be found inter alia in the cited U.S. Pat. No. 4,074,302. In the situation shown here, where the detector is connected in a source follower configuration, a voltage is applied to the gate electrode 18 such that a p-type inversion channel is formed between the source 14 and drain 16 of the MOST 12, also in the presence of electrons in the charge storage regions 19. A packet of electrons stored below clock electrode 9 is transported through reduction of the voltage at electrode 9 to the charge storage regions 19 below the gate electrode 18, where it controls the conduction between source and drain of MOST 12 in the manner of a so-called backgate. For read-out, the MOST 12 may be included in a source follower circuit in which the source zone 14 is connected to a current source 23. The signal may be taken off at output terminal 24. The packet of electrons may be discharged after read-out through the reset gate 20 and drain 22.

The manufacture of the device described here starts with an n-type silicon body built up, for example, from a comparatively low-ohmic n-type substrate, and an n-type epitaxial layer 2 provided thereon with a comparatively high resistivity, for example, with a doping of $4*10^{14}$ atoms per $cm^3$. A p-type well is provided at the surface by ion implantation, from which subsequently the p-type layer 4 is formed. This implantation is carried out, for example, with boron ions with an energy of approximately 80 keV and a dose of $1.1*10^{12}$ per $cm^2$ which, after heat treatment, results in a p-type well with a depth of 3.5 µm. The charge transport channel 1 is implanted into the p-type well thus obtained by means of a deep n-implantation. The implantation energy is, for example, again approximately 80 keV, and the dose again approximately $1.1*10^{12}$ phosphorus atoms per $cm^2$ which, after heat treatment, results in the charge transport channel 1 whose depth is approximately 0.8 µm. A layer of approximately 2.7 µm thickness accordingly remains for the anti-blooming barrier layer 4 between the channel 1 and the substrate 6, i.e. so thin that this layer is depleted throughout its thickness during operation at the usual operational voltages. In a third doping step, the channel bounding regions 3, the source zone 14, and the drain zone 3, 16 are provided, for which purpose boron ions are implanted at an energy of approximately 50 keV and a dose of $2*10^{13}$ per $cm^2$, a doping mask being used. The source and drain zones in the example shown here both adjoin the p-type zone 4. This, however, is no disadvantage because this layer is depleted during operation and thus forms no conductive connection between source and drain. After these three implantation steps, the gate dielectric 10 is formed on the surface of the semiconductor body. This layer may be provided in the form of a single oxide layer, but may alternatively be provided as a composite layer of silicon oxide with a layer of silicon nitride.

Figure 4:
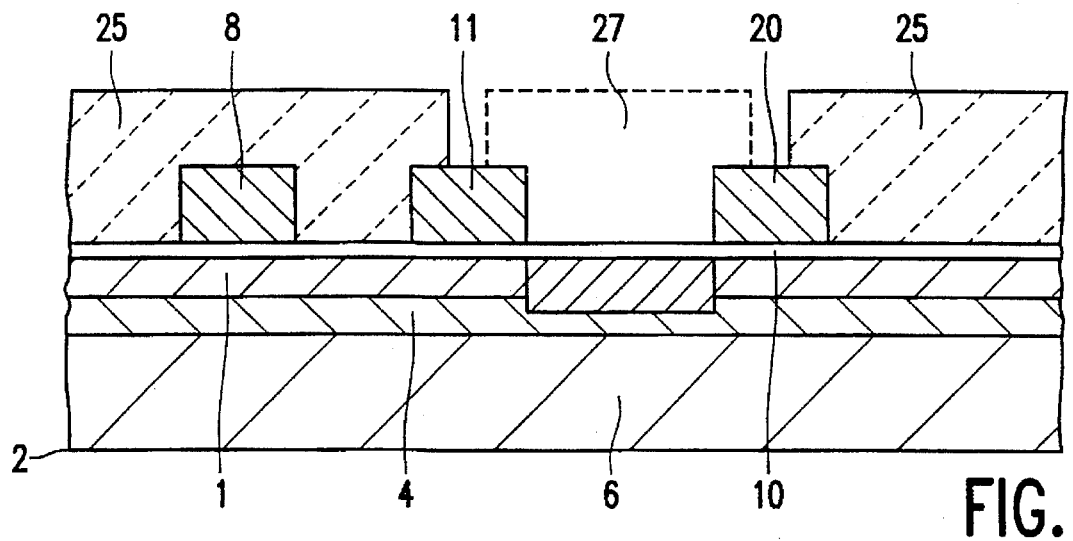
FIGS. 4 and 5 show the device in cross-sections taken on the lines III—III and II—II, respectively, in a several stages of manufacture.

On the gate dielectric 10, a first layer of doped poly is formed from which the electrodes 8, 11 and 20 are obtained by means of a masked etching step. The assembly is then covered with a mask 25, for example a photoresist layer, which in conjunction with the poly electrodes 11 and 20 forms doping windows which define the regions 19. It is noted here that, seen in the charge transport direction, the regions 19 are automatically aligned relative to the gates 11 and 20, so that a critical alignment step in this direction is avoided. In the direction transverse thereto, the surface is masked by a portion 27 of the mask 25, which portion is indicated with broken lines in FIG. 4 and which approximately covers at least the region where in a later stage the extensions 26 will be provided. Then phosphorus ions are implanted into the semiconductor body with an energy of 180 keV and a concentration of approximately $2*10^{12}$ per $cm^2$ so as to obtain the n-type zones 19. The device in this stage is depicted in FIG. 4.

Figure 5:
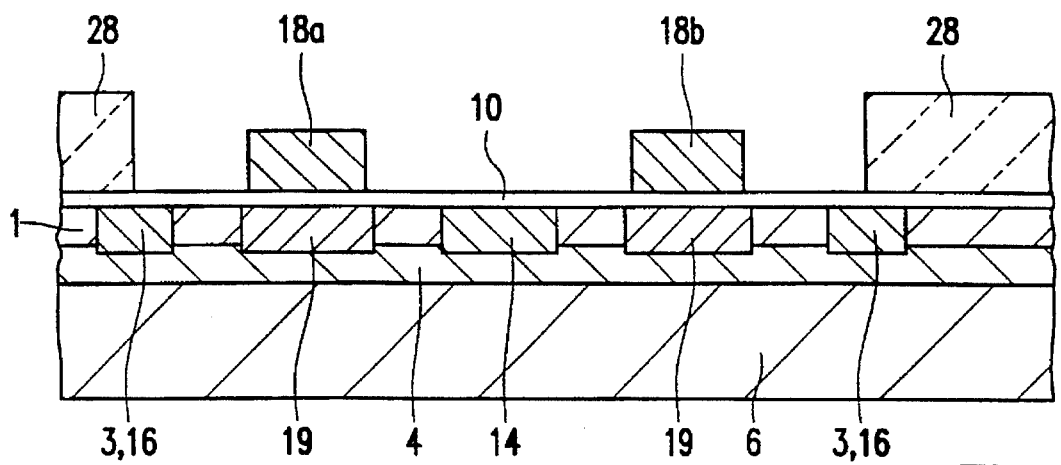

After removal of the mask 25 and a heat treatment, the second poly layer is provided, from which the gates 7, 9 and 18a, 18b are formed. In the direction parallel to the charge transport direction, the edges of the gates 18 coincide practically with the edges of the zones 19. In the direction transverse thereto, so in the direction from source zone 14 to drain zone 16, the gates 18 are not self-aligned with the zones 19, so that it is possible for the zones 19 to project beyond the gates in this direction. Such a possible misalignment is compensated, at least partly, through the application of the p-type extensions 26 in the regions situated between the source and drain zones 14, 16 on the one hand and the gates 18 on the other. For this purpose, another mask 28 is provided which masks portions of the surface not covered by poly against implantation. FIG. 5 shows the device in this stage in a cross-section taken on the line II—II in FIG. 1. The extensions may then be provided through implantation of boron ions with an energy of, for example, 25 keV and a dose of $5*10^{12}$ per $cm^2$. Since the gates 18 act as an implantation mask, the extensions 26 are accurately aligned relative to the gates 18, as is pictured in FIG. 2, and thus compensate through overdoping at least partly for effects caused by a possible misalignment of the zones 19 relative to the gates 18. The extensions 26 not only cause a low resistance of the MOST 12, but also have a small depth, so that the overlap with the gates 18a and 18b, and thus the parasitic capacitance, is only small, which is favourable for the noise behaviour of the transistor. Further process steps such as the provision of n-type zones for n-channel MOS transistors, the provision of contacts and covering of the device with a passivating layer may be carried out in a manner known in the technology and are not described any further.

The charge detector described here can be manufactured in a largely self-aligned manner. It is noted in particular that the zones 19, which are doped before the gates 18 are provided, are in effect nevertheless accurately positioned relative to the gates 18 owing to the extensions 26. This is important for the sensitivity of the detector because the charge packets to be detected are mainly stored in a charge storage region below the gate 18 as a result of this, and from this storage region determine the surface potential in the channel of the MOST, and thus the conduction in the MOST. Since furthermore the MOST detector is of double-sided construction, the effective width of the transistor is great, so that both the noise behaviour and the charge storage capacity of the transistor are good. At the same time, the gate 18, which also acts as a gate electrode of the charge coupled device, may have a width comparable to the length of the clock electrodes 7, 8, 9, etc., so that the speed characteristics of the charge coupled device are not or at most slightly influenced.

Figure 2:
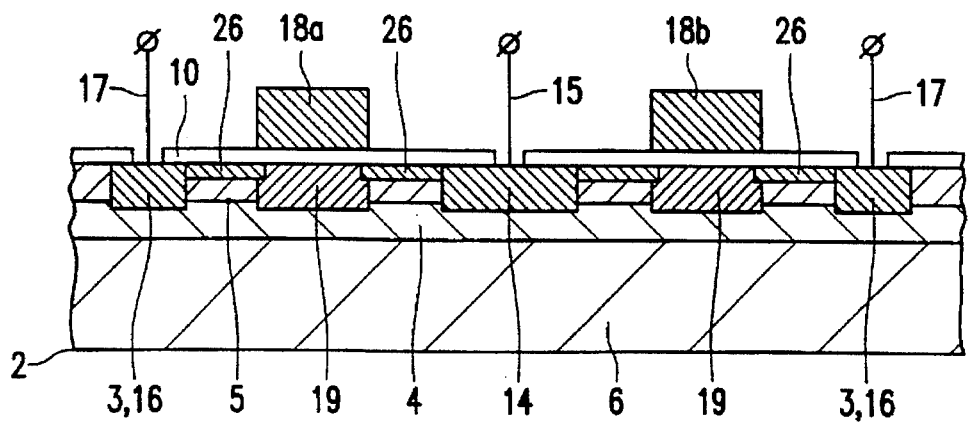
FIG. 2 is a cross-section of this device taken on the line II—II.
Figure 6:
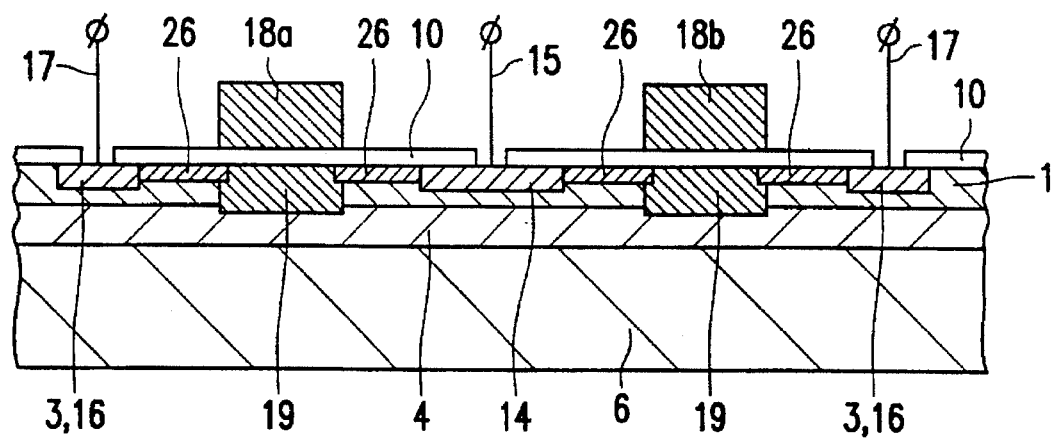
FIG. 6 is a cross-section corresponding to that of FIG. 2 of a second embodiment of a device according to the invention.

FIG. 6 is a cross-section corresponding to the cross-section of FIG. 2 of a second embodiment of a device according to the invention. To simplify the description, corresponding components in FIG. 6 have been given the same reference numerals as those in FIG. 2. The main difference with the embodiment of FIG. 2 is that the charge coupled device is of the complementary conductivity type, i.e. the p-type, where the signals are formed by hole packets, and that the charge detector is formed by a surface MOST of the n-channel type. The charge transport channel is for this purpose formed by a p-type surface layer 1, provided in a p-type semiconductor body 6, and separated from the p-type body 6 by an interposed n-type region 4. The charge transport channel is laterally bounded by the bounding region 3 which in this case is of the n-conductivity type. The charge storage region 19 is formed by a p-type zone whose doping concentration is higher than that of the layer 1. The source and drain zones 14, 16 and the extensions 26 which connect the source and drain zones to the channel region below the gates 18a and 18b are formed by n-type zones.

This embodiment has the advantage inter alia of good noise properties because the mobility of electrons is higher than that of holes, and thus the current is also higher, and because a dopant such as As or possibly Sb having a low diffusion constant may be used for doping the extensions 26, which diffusion constant is at least much lower than that of B, so that the extensions 26 do not or only very slightly extend below the gate 18, so that also the parasitic capacitance is very low.

The doping concentrations may correspond to the doping concentrations in the preceding example. A further difference with the preceding embodiment is that the source and drain zones 14 and 16 and the bounding region 3 do not extend into the region 4, but only extend from the surface of the semiconductor body over part of the thickness of the charge transport channel 1. Between the zones 3, 16 and the region 4, a portion of the p-type layer 1 remains which may be pinched off by the field effect. It is avoided in this embodiment that leakage currents can flow through the zone 4 between the source and drain zones 14 and 16 of the MOST.

Figure 7:
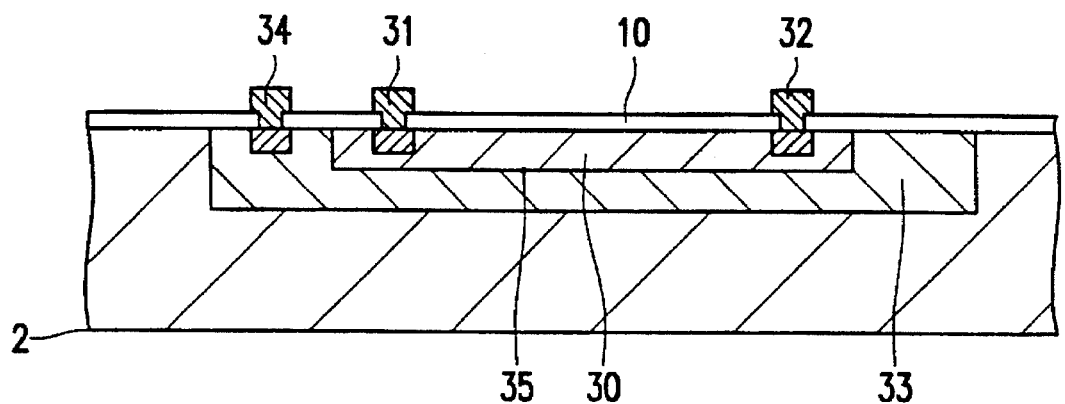
FIG. 7 is a cross-section of a resistor which may be used in combination with a charge detector according to the invention.

A resistance may be used as the current source 23 (FIG. 1) in a manner known per se. FIG. 7 shows an embodiment which is particularly suitable for this purpose and which has the advantage of very low parasitic capacitances. The embodiment described by way of example here is adapted to the first embodiment of an n-channel CCD according to FIG. 1. A resistance suitable as a current source in the embodiment of FIG. 6 may be simply obtained through reversion of the conductivity types. The resistance comprises an n-type zone 30 which is formed simultaneously with the n-type CCD channel 1 and which accordingly has the same thickness and composition as the channel 1. The resistance zone 30 is provided with two connection contacts 31 and 32 for the lowest and the highest voltage, respectively. The zone 30 is surrounded within the semiconductor body 2 by a p-type zone 33 which is manufactured simultaneously with the p-type well 4 (FIGS. 2 and 3) and which accordingly has the same thickness and doping concentration as the zone 4. The zone 33 may be conductively connected to the p-type well 4 in which the CCD channel is formed, for example, via a connection 34. During operation, a high voltage is applied to the connection point 32, for example 15 V, so that the voltage at connection point 31, which is connected to the source 14, will be approximately 0 V. Under these conditions, the p-type zone 33 below the zone 30 will be fully depleted, similar to the zone 14 below the CCD channel 1. The parasitic capacitance of the resistance 30 is mainly determined by the capacitance of the pn junction 35 between the zones 30 and 33. Since the zone 33 is depleted throughout its thickness, this capacitance is very small. A resistance is thus obtained with a very low capacitance with the exclusive use of process steps which were used anyway for manufacturing the charge coupled device.

It will be apparent that the invention is not limited to the embodiments given here but that many more variations are possible to those skilled in the art within the scope of the invention. Thus the gate dielectric 10 may comprise materials other than silicon oxide such as, for example, silicon nitride or oxynitride. The invention may be used to advantage not only in imaging devices but in all other types of charge coupled devices which are known per se.

I claim:

1. A charge coupled device of the buried channel type comprising a semiconductor body which at a surface is provided with a charge transport channel in the form of a surface region of a first conductivity type which is laterally bounded in the semiconductor body by a bounding region of an opposite, second conductivity type and which is provided with a charge detector in the form of an insulated-gate surface-channel field effect transistor, a surface zone of the second conductivity type being provided locally in the charge transport channel so as to form a source zone of the field effect transistor, portions of the bounding region of the second conductivity type on either side of the charge transport channel forming a drain zone of the field effect transistor adjacent the source zone, and portions of the charge transport channel between the source and drain zones forming a channel region of the field effect transistor, characterized in that the gate electrode comprises two sub-regions which, seen at the surface, are situated on either side of the source zone and which extend between the source zone and the bounding region without overlap, at least one zone of the same conductivity type but with a higher doping concentration than that of the charge transport channel being provided in the charge transport channel, said zone extending at least for the major part exclusively below the sub-regions of the gate electrode, and the source and drain zones being provided with extensions of the second conductivity type which, seen at the surface, extend between the source and drain zones and the sub-regions of the gate electrode.

2. A charge coupled device as claimed in claim 1, characterized in that the source zone and the bounding region of the second conductivity type are formed by zones which were provided in the semiconductor body in the same doping step.

3. A charge coupled device as claimed in claim 2, characterized in that the source zone, the bounding region, and the drain zone of the field effect transistor, extend from the surface over at least substantially the entire thickness of the charge transport channel into the semiconductor body.

4. A charge coupled device as claimed in claim 3, characterized in that the semiconductor body comprises a substrate of the first conductivity type which, at least at the side opposed to the surface, is separated from the charge transport channel by an interposed region of the second conductivity type whose thickness and doping concentration are so small that during operation a depletion region is formed which extends over the entire thickness of the interposed region between the substrate and the charge transport channel.

5. A charge coupled device as claimed in claim 1, characterized in that the extensions of the source and drain zones have a thickness which is smaller than that of the source and drain zones.

6. A charge coupled device as claimed in claim 1, characterized in that the charge transport channel is of the p-type and the source and drain zones of the field effect transistor are of the n-type.

7. A charge coupled device as claimed in claim 6, characterized in that the extensions of the source and drain zones are doped with As atoms.

8. An imaging device comprising a charge coupled device as claimed in claim 1.

* * * * *